(12) United States Patent
Zhang

(10) Patent No.: US 8,916,938 B2
(45) Date of Patent: Dec. 23, 2014

(54) THREE-DIMENSIONAL WRITABLE PRINTED MEMORY

(71) Applicant: ChengDu HaiCun IP Technology LLC, ChengDu (CN)

(72) Inventor: Guobiao Zhang, Corvallis, OR (US)

(73) Assignees: ChengDu HaiCun IP Technology LLC, ChengDu, SiChuan (CN); Guobiao Zhang, Corvallis, OR (US)

( * ) Notice: Subject to any disclaimer, the term of this patent is extended or adjusted under 35 U.S.C. 154(b) by 0 days.

(21) Appl. No.: 14/179,559

(22) Filed: Feb. 13, 2014

(65) Prior Publication Data
US 2014/0179124 A1    Jun. 26, 2014

Related U.S. Application Data

(62) Division of application No. 13/599,112, filed on Aug. 30, 2012, now Pat. No. 8,699,257.

(60) Provisional application No. 61/529,922, filed on Sep. 1, 2011.

(51) Int. Cl.
H01L 21/70      (2006.01)
H01L 23/52      (2006.01)
G11C 17/06      (2006.01)
H01L 21/82      (2006.01)
H01L 21/44      (2006.01)
H01L 27/112     (2006.01)
H01L 21/268     (2006.01)

(52) U.S. Cl.
CPC ........ H01L 21/268 (2013.01); H01L 27/11206 (2013.01)
USPC ........... 257/390; 257/211; 365/103; 365/105; 438/131; 438/600

(58) Field of Classification Search
USPC ........................................... 257/390
See application file for complete search history.

(56) References Cited

U.S. PATENT DOCUMENTS 6,185,122 B1 *  2/2001  Johnson et al. ............. 365/103
6,624,485 B2 *  9/2003  Johnson ....................... 257/390
6,689,644 B2 *  2/2004  Johnson ....................... 438/131

* cited by examiner

Primary Examiner — Son Mai

(57) ABSTRACT

The present invention discloses a three-dimensional writable printed memory (3D-wP). It comprises at least a printed memory array and a writable memory array. The printed memory array stores contents data, which are recorded with a printing means; the writable memory array stores custom data, which are recorded with a writing means. The writing means is preferably direct-write lithography. To maintain manufacturing throughput, the total amount of custom data should be less than 1% of the total amount of content data.

9 Claims, 6 Drawing Sheets

THREE-DIMENSIONAL WRITABLE PRINTED MEMORY

CROSS-REFERENCE TO RELATED APPLICATIONS

This application is a divisional of a non-provisional application "Three-Dimensional Writable Printed Memory", application Ser. No. 13/599,112, filed Aug. 30, 2012, which claims the benefit of a provisional application, "Three-Dimensional Printed Memory with Direct-Write Section", Application Ser. No. 61/529,922, filed Sep. 1, 2011.

BACKGROUND

1. Technical Field of the Invention

The present invention relates to the field of integrated circuit, and more particularly to mask-programmed read-only memory (mask-ROM).

2. Prior Arts

Three-dimensional mask-programmed read-only memory (3D-MPROM) has the potential to replace DVD and Blu-Ray Discs. It is ideal for mass publication. U.S. Pat. No. 5,835,396 discloses a 3D-MPROM. It is a monolithic semiconductor memory. As illustrated in FIG. 1, a typical 3D-MPROM comprises a semiconductor substrate 0 and a 3-D stack 10 stacked above. The 3-D stack 10 comprises M (M≥2) vertically stacked memory levels (e.g. 10A, 10B). Each memory level (e.g. 10A) comprises a plurality of upper address lines (e.g. 2a), lower address lines (e.g. 1a) and memory cells (e.g. 5aa). Each memory cell stores n (n≥1) bits. Memory levels (e.g. 10A, 10B) are coupled to the substrate 0 through contact vias (e.g. 1av, 1av'). The substrate 0 comprises transistors. Transistors and their interconnects form a substrate level 0K, which comprises a peripheral circuit for the 3D-MPROM. Hereinafter, xM×n 3D-MPROM denotes a 3D-MPROM comprising M memory levels with n bits-per-cell (bpc).

3D-MPROM is a diode-based cross-point memory. Each memory cell (e.g. 5aa) typically comprises a diode 3d. The diode can be broadly interpreted as any device whose electrical resistance at the read voltage is lower than that when the applied voltage has a magnitude smaller than or polarity opposite to that of the read voltage. The memory level further comprises a data-coding layer, whose pattern is data-pattern and represents data stored in the data-coding layer. In FIG. 1, the data-coding layer 6A in the memory level 10A comprises a blocking dielectric 3b. It blocks the current flow between the upper and lower address lines. Absence or existence of a data-opening 6ca in the blocking dielectric 3b indicates the state of a memory cell. Besides the blocking dielectric 3b, the data-coding layer 6A could also comprise a resistive layer (referring to U.S. patent application Ser. No. 12/785,621) or an extra-dopant layer (referring to U.S. Pat. No. 7,821,080).

In many applications, writing custom data to a 3D-MPROM is desired. Hereinafter, custom data refers to the data which could be unique for different users. For example, to improve the data security, it is desired to store different encryption keys in different 3D-MPROM dice, even though they store the same contents (referring to U.S. patent application Ser. No. 13/027,274). In prior arts, this is implemented with an electrically-programmable read-only memory (EPROM) 0e or laser-programmable fuse. However, EPROM requires a high programming voltage and extra process steps, which increases the wafer cost. On the other hand, a laser-programmable fuse occupies a large silicon area, typically ~100 µm². Moreover, the laser-programmable fuses are only formed on the wafer surface. Its data can be easily accessed. As a result, the data security will be compromised.

OBJECTS AND ADVANTAGES

It is a principle object of the present invention to provide a 3D-MPROM where custom data can be written at a lower cost.

It is a further object of the present invention to provide a method to write custom data to 3D-MPROM.

In accordance with these and other objects of the present invention, a three-dimensional writable printed memory (3D-wP) is disclosed. The name "printed memory" is used to distinguish the printing feature of this memory. In the present invention, "print" is another expression for "mask-program".

SUMMARY OF THE INVENTION

The present invention discloses a three-dimensional writable printed memory (3D-wP). It is an improved 3D-MPROM. 3D-wP comprises at least a printed memory array and a writable memory array. The printed memory array stores contents data. Content data contain the data of mass-contents, such as movies, video games, maps, music library, book library, and softwares. They are recorded with a printing means. Printing is primarily a parallel recording process. Major printing means include photo-lithography and imprint-lithography.

On the other hand, the writable memory array stores custom data. Custom data contain the data of custom information such as chip ID and encryption keys. They are generally of little interest to end users. Custom data are recorded with a writing means. Writing is primarily a serial recording process. Major writing means is direct-write lithography, e.g. e-beam lithography, laser-beam lithography or focused ion-beam lithography. Within a 3D-wP batch, all dice store the same content data, but may have different custom data. To maintain manufacturing throughput, the total amount of custom data is preferably less than 1% of the total amount of content data.

Figure 1:
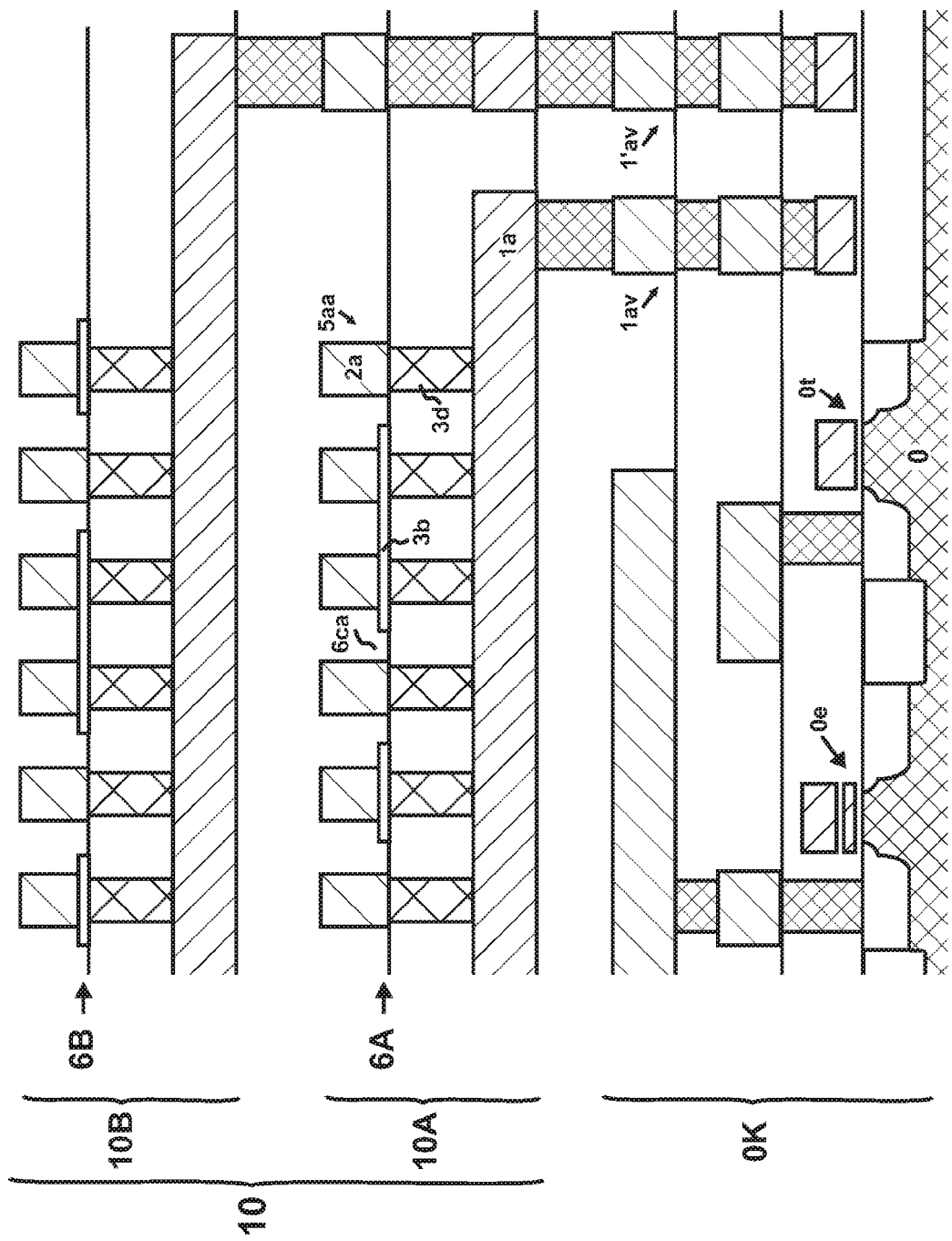
FIG. 1 is a cross-sectional view of a 3D-MPROM with an EPROM from prior arts.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 2A:
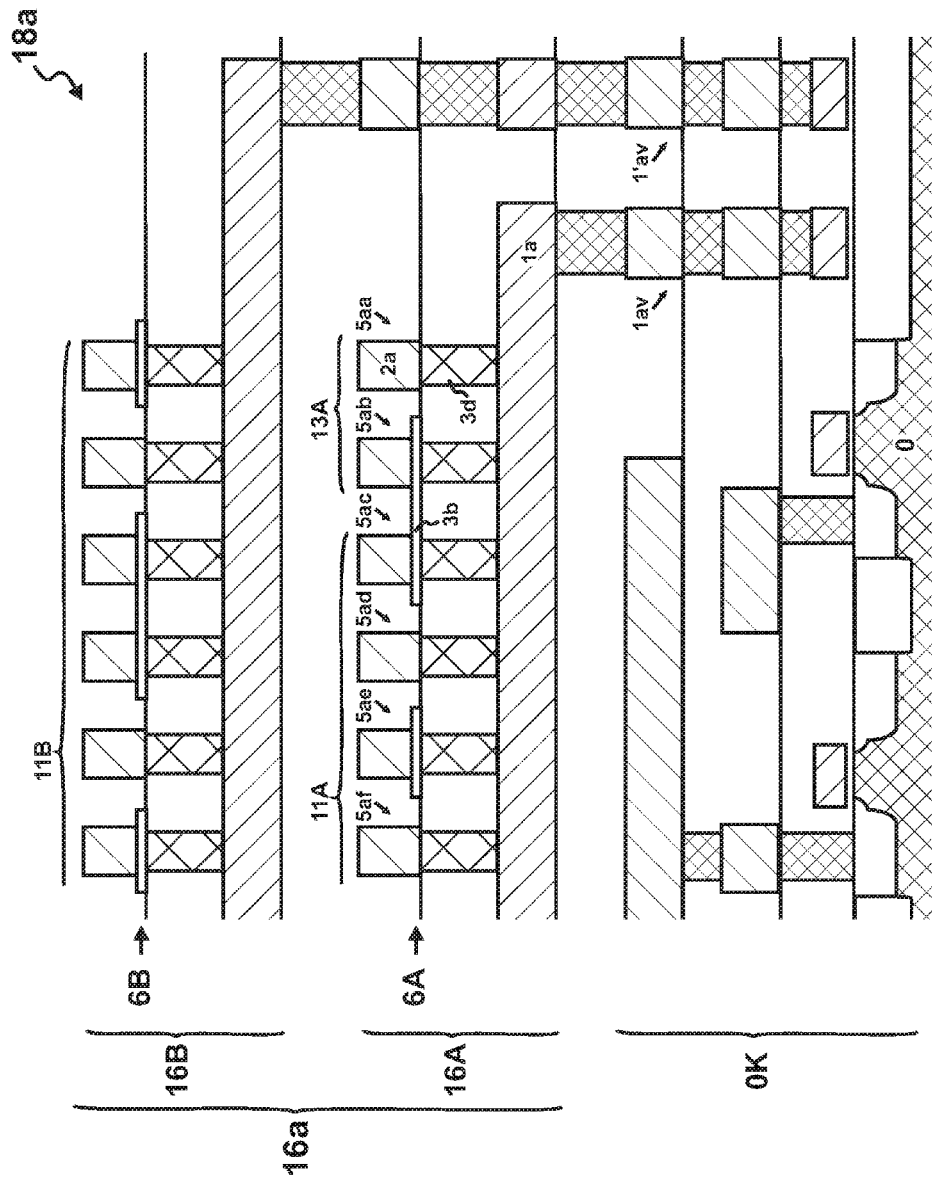
FIGS. 2A-2B are cross-sectional views of two dice from a preferred 3D-wP batch.
Figure 2B:
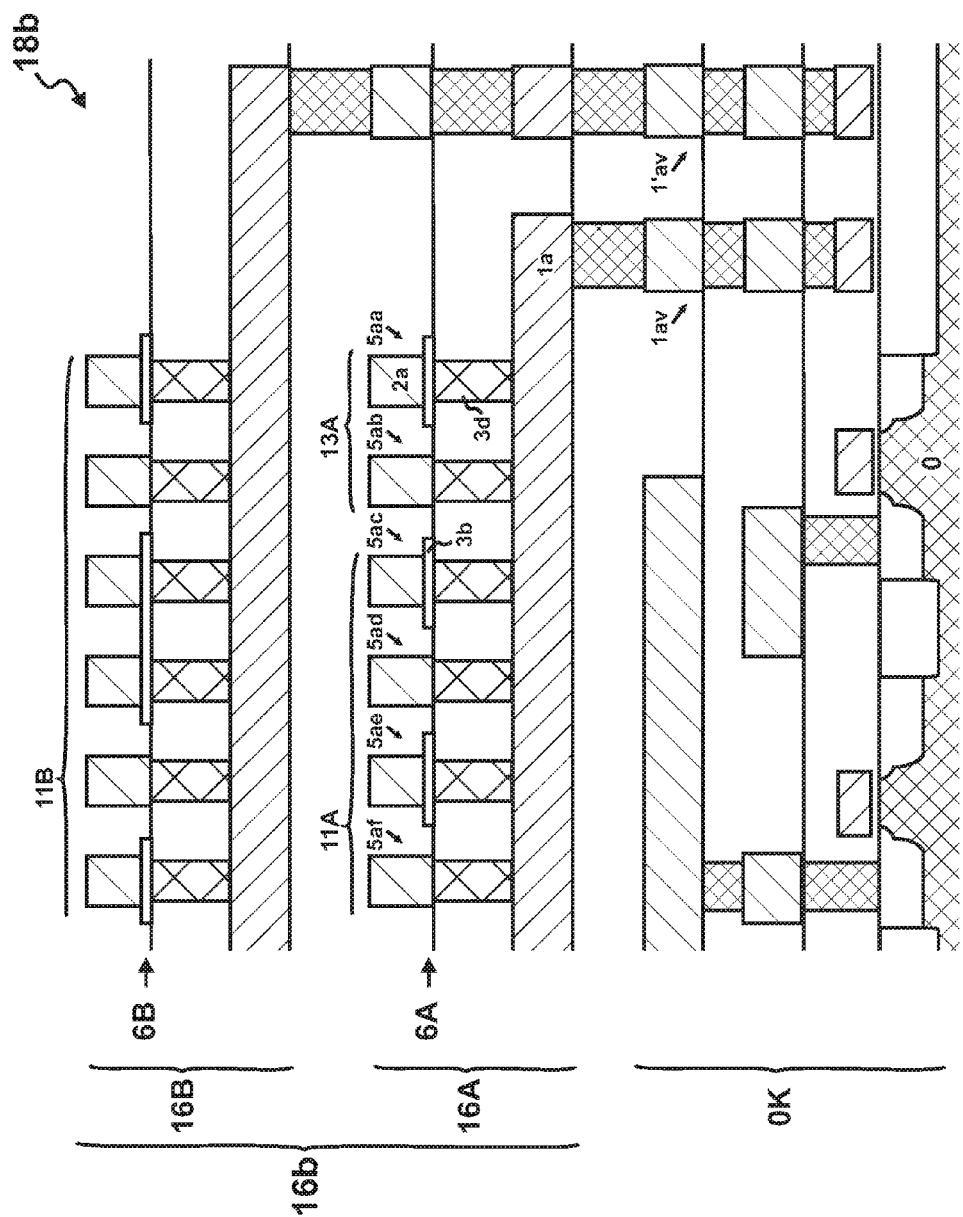

Referring now to FIGS. 2A-2B, two dice 18a, 18b from a preferred 3D-wP batch are disclosed. In a 3D-wP batch, all dice are manufactured with the same mask set. The dice 18a, 18b store the same content data but different custom data. Each 3D-wP die (e.g. 18a) comprises a semiconductor substrate 0 and a 3-D stack (e.g. 16a) stack above. The transistors and interconnects form a substrate level 0K. The 3-D stack 16a comprises two memory levels 16A, 16B, whose memory cells typically comprise diodes 3d.

The memory level 16A comprises a printed memory array 11A (including memory cells 5ac-5af) and a writable memory array 13A (including memory cells 5aa, 5ab), and the memory level 16B comprises just a printed memory array 11B. The printed memory arrays 11A, 11B store content data. Content data contain the data of mass-contents, such as movies, video games, maps, music library, book library, and softwares. They are recorded into the printed memory arrays 11A, 11B with a printing means. Printing is primarily a parallel recording process. Major printing means include photolithography and imprint-lithography. Printing uses datamasks to record data. Here, data-mask could be data-mask used in photo-lithography, or, data-template used in imprint-lithography.

On the other hand, the writable memory array 13A stores custom data. Custom data includes the data of custom information such as chip ID and encryption keys. They are recorded into the writable memory array 13A with a writing means. Writing is primarily a serial recording process. Major writing means is direct-write lithography, e.g. e-beam lithography, laser-beam lithography or focused ion-beam lithography. Direct-write lithography does not use any data-mask.

In the die 18a, the digital values ('0' or '1') represented by the data-coding layer 6A at each memory cell form a data-array $P_{18a}[1]$. It further includes the printed data-array $p_{18a}[1]$, which is stored in the printed memory array 11A, and the writable data-array $w_{18a}[1]$, which stored in the writable memory array 13A. In other words, $P_{18a}[1]=p_{18a}[1]+w_{18a}[1]$. More details of the data-array can be found in U.S. Pat. App. Ser. No. 61/529,920, "Three-Dimensional Offset-Printed Memory".

On the other hand, the data-array $P_{18a}[2]$ stored in the data-coding layer 6B for the memory level 16B is just the printed data-array $p_{18a}[2]$, i.e. $P_{18a}[2]=p_{18a}[2]$, because the memory level 16B comprises no writable memory array. Overall, the printed data-array sequence $S_{18a}$ of the die 18a can be expressed as: $S_{18a}=(p_{18a}[1], p_{18a}[2])$. Here, a data-array sequence is an ordered list of all data-arrays in a die. More details of the data-array sequence can be found in U.S. Pat. App. Ser. No. 61/529,920, "Three-Dimensional Offset-Printed Memory".

Similarly, for the die 18b of FIG. 2B, the data-array $P_{18b}[1]$ stored in the data-recording layer 6A for the memory level 16A includes the printed data-array $p_{18b}[1]$ and the writable data-array $w_{18b}[1]$, i.e. $P_{18b}[1]=p_{18b}[1]+w_{18b}[1]$; the data-array $P_{18b}[2]$ stored in the data-coding layer 6B of the memory level 16B includes only the printed data-array $p_{18b}[2]$, i.e. $P_{18b}[2]=p_{18b}[2]$. The printed data-array sequence for the die 18b is $S_{18b}=(p_{18b}[1], p_{18b}[2])$.

Within a 3D-wP batch, all dice 18a, 18b store the same content data and have the same printed data-array set $\{S_{18a}\}$ and $\{S_{18b}\}$, i.e. $\{S_{18a}\}=\{p_{18a}[1], p_{18a}[2]\}$; $\{S_{18b}\}=\{p_{18b}[1], p_{18b}[2]\}$; with $\{S_{18a}\}=\{S_{18b}\}$. Here, a printed data-array set is a collection of all printed data-arrays in a die. More details of the data-array set can be found in U.S. Pat. App. Ser. No. 61/529,920, "Three-Dimensional Offset-Printed Memory".

During a data-recording process, if conventional printing means is used, the printed data-array sequences $S_{18a}$, $S_{18b}$ of the dice 18a, 18b should be same (referring to U.S. Pat. App. Ser. No. 61/529,919, "Three-Dimensional Printed Memory"). If offset-printing is used, the printed data-array sequences $S_{18a}$, $S_{18b}$ of the dice 18a, 18b may be different. To be more specific, $p_{18}[1]$ for the memory level 16A of the die 18a could be same as the printed data-array $p_{18b}[2]$ for the memory level 16B of the die 18b (referring to the co-pending U.S. Pat. App. Ser. No. 61/529,920, "Three-Dimensional Offset-Printed Memory").

On the other hand, within the 3D-wP batch, the dice 18a, 18b may store different custom data and their writable memory array 13A may have different writable data-arrays $w_{18a}[1]$, $w_{18b}[1]$. For example, in the writable memory array 13A of the die 18a, the memory cell 5aa stores '1' and the memory cell 5ab stores '0' (FIG. 2A); whereas, in the writable memory array 13A of the die 18b, the memory cell 5aa stores '0' and the memory cell 5ab stores '1' (FIG. 2B). Even though the data in the writable memory array 13A are different, the dice 18a, 18b still belong to the same 3D-wP batch, because writing custom data does not require any data-mask.

Although writing can record custom data, its throughput is slow. Even the throughput for multi-beam e-beam direct-write (referring to Kampherbeek, "High Throughput Maskless Lithography") is ~1 wafer-per-hour, which is about 100 times slower than printing. To maintain throughput, the total amount of custom data should be limited in such a way that the writing time is comparable to the printing time. Namely, the total amount of custom data is preferably less than 1% of the total amount of content data.

Figure 3A:
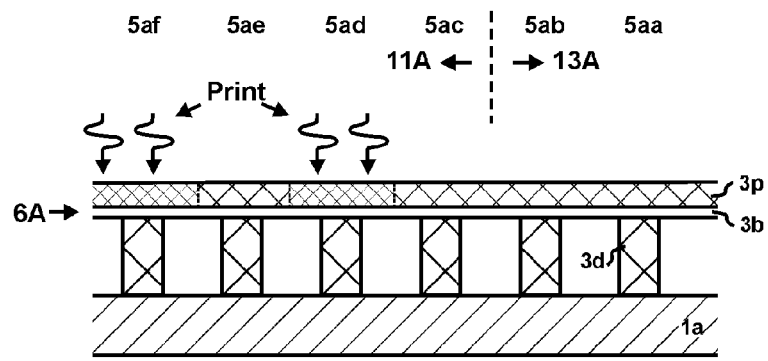
FIGS. 3A-3D disclose the manufacturing steps to record data in the preferred 3D-wP of FIGS. 2A-2B.
Figure 3B:
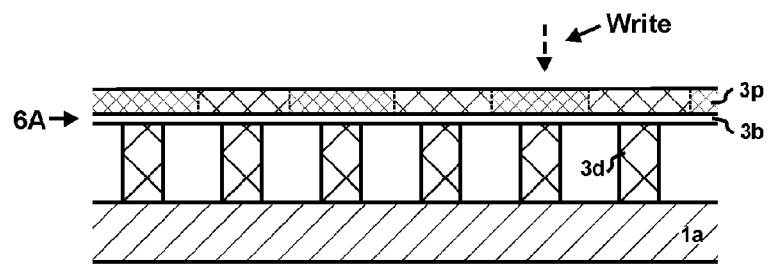
Figure 3C:
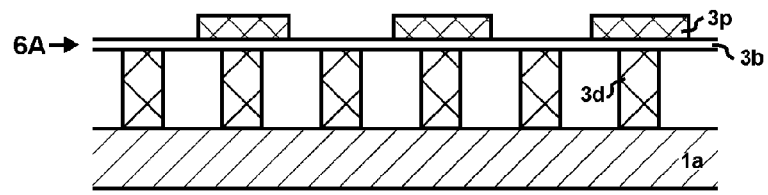
Figure 3D:
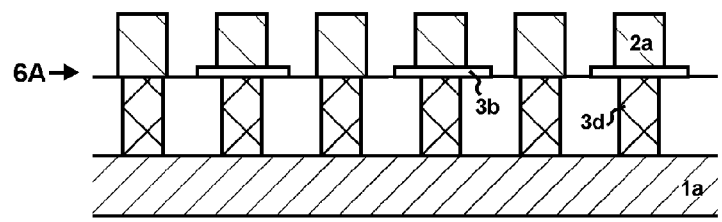

FIGS. 3A-3D disclose the manufacturing steps to record both content data and custom data into the preferred 3D-wP. It comprises a printing step and a writing step. After forming the blocking dielectric layer 3b, a photo-resist layer 3p is coated onto the surface of the wafer. A printing step transfers the patterns for content data into the photo-resist layer 3p (FIG. 3A). This printing step could use either photo-lithography or imprint-lithography. For example, photo-lithography uses a data-mask to expose the photo-resist layer 3p at the cell locations 5ad, 5af. Then a writing step transfers the patterns for custom data into the photo-resist layer 3p (FIG. 3B). Here, the writing step uses direct-write lithography. The direct-write lithography does not use any data-mask. Instead, it uses a controlled beam (e.g. e-beam, laser beam or focused ion beam) to expose the photo-resist layer 3p bit-by-bit, e.g. at the cell location 5ab. After the printing and writing steps, the photo-resist layer 3p is developed (FIG. 3C) and the photo-resist at the cell locations 5af, 5ad, 5ab are removed. This is followed by an etching step that removes the exposed blocking dielectric 3b (FIG. 3D). After these steps, both content data and custom data are recorded into the memory level 16A.

Figure 4:
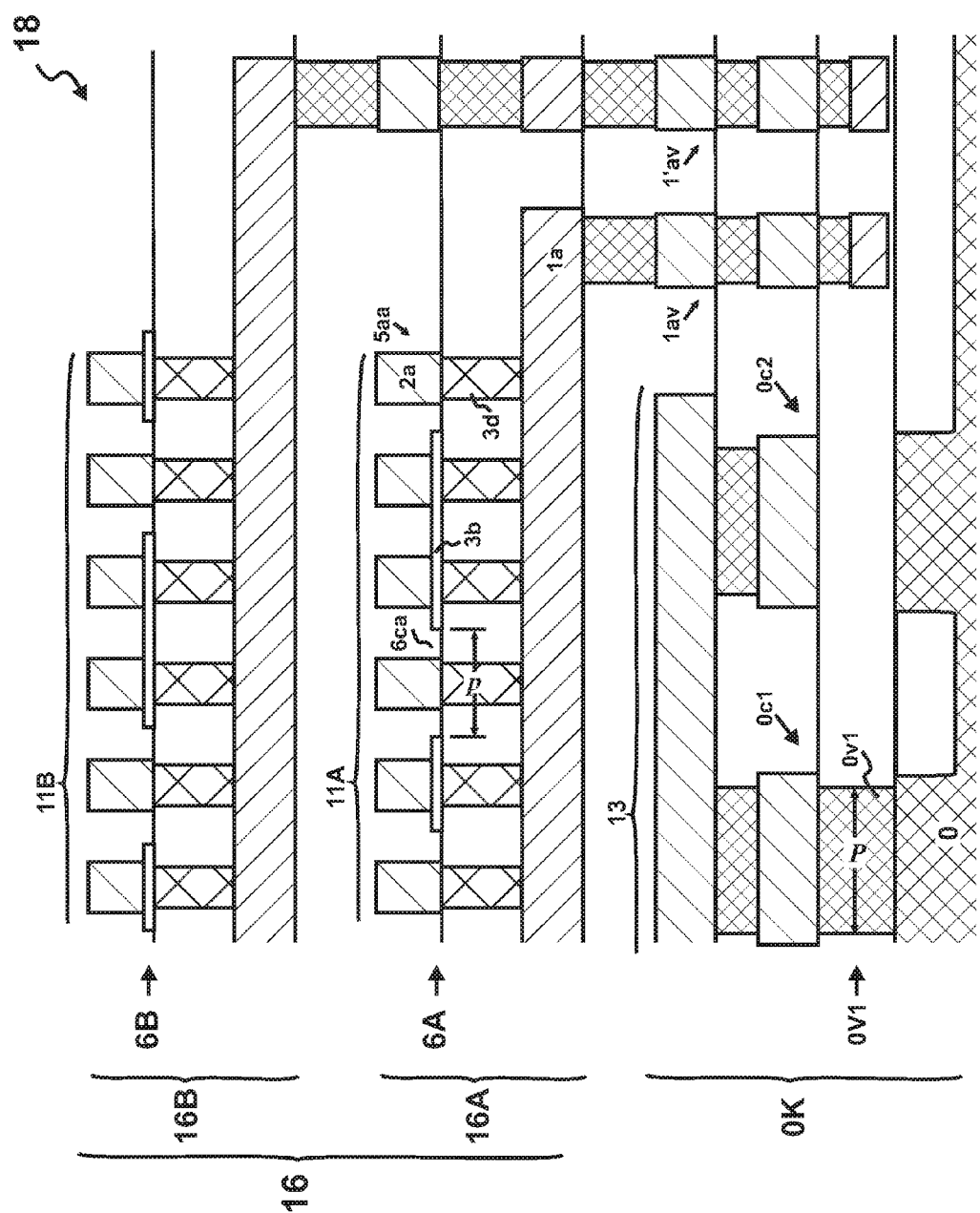
FIG. 4 is a cross-sectional view of another preferred 3D-wP.

Referring now to FIG. 4, another preferred 3D-wP is disclosed. In this preferred embodiment, the memory levels 16A, 16B comprise only printed memory arrays 11A, 11B. The writable memory array 13 is formed in the substrate level 0K. Its memory cells 0c1, 0c2 are transistor-based. The substrate level 0K further comprises at least one data-coding layers 0V1, i.e. existence of a via 0v1 represents '1', and absence of a via represents '0'. By writing on the data-coding layer 0V1, the memory cells 0c1, 0c2 can store custom data. Note that the minimum feature size P of the via 0v1 can be much larger than the minimum feature size p of the data-opening 6ca in the memory level 16A. Accordingly, even if the printed memory array uses advanced memory technology (e.g. p=44 nm), the writable memory array could use a relatively backward technology (e.g. P=2 um). The advantage of this approach is that inexpensive writing technique, such as laser-beam lithography, can be used for writing.

Figure 5:
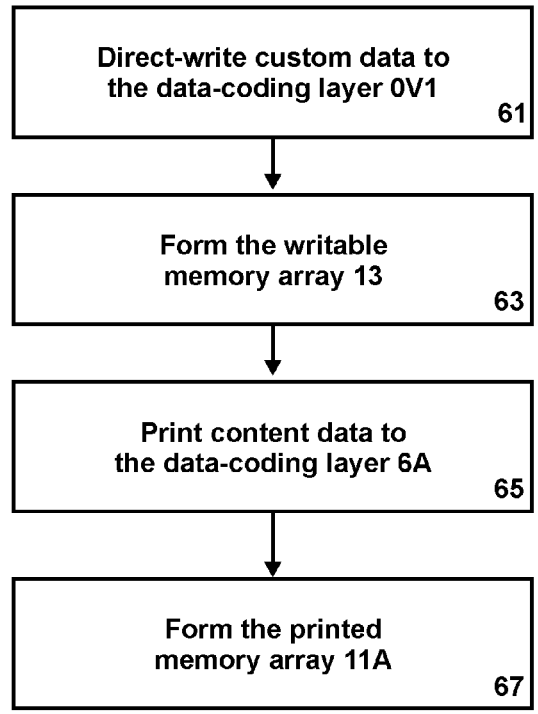
FIG. 5 discloses the data-recording steps for the preferred 3D-wP of FIG. 4 during manufacture.

FIG. 5 discloses the data-recording steps for the preferred 3D-wP of FIG. 4 during manufacture. These steps include writing step 61, 63 and printing step 65, 67. First of all, custom data are written to the data-coding layer 0V1 in the substrate layer 0K (step 61). This writing step does not use any data-mask. Instead, it uses e-beam, laser or focused ion beam to write data bit-by-bit. After forming the writable memory array 13 (step 63), content data are printed to the data-coding layer 6A on the memory level 16A (step 65). This printing step uses a data-mask and forms the printed memory array 11A (step 67).

Figure 6:
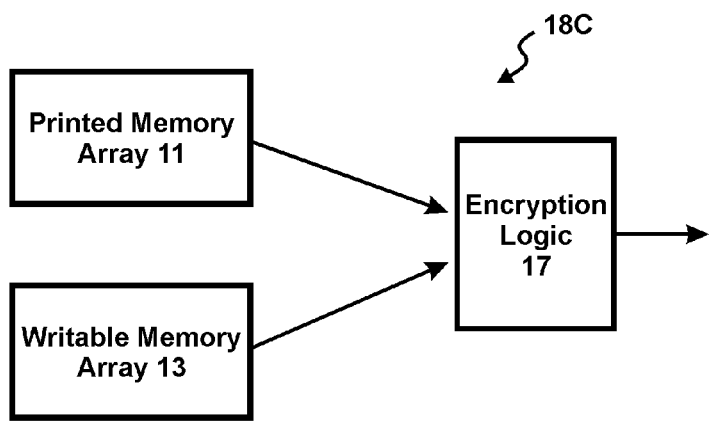
FIG. 6 is a block diagram of a preferred 3D-wP with improved data security.

FIG. 6 is a block diagram of a preferred 3D-wP 18C with improved data security. It comprises a printed memory array 11, a writable memory array 13 and an encryption logic 17. They are preferably integrated in a 3D-wP die. The printed memory array 11 stores content data, while the writable memory array 13 stores the encryption key for this 3D-wP die 18C, which can be customized. As a result, even though each die within a 3D-wP batch stores the same content data, the output of each die can be encrypted by different keys and therefore, takes different form. This can significantly improve the data security. To deter reverse-engineering, at least a portion of the writable memory array 13 is preferably formed below the topmost level 16B of the 3D-wP die, e.g. on the lower memory level 16A, or in the substrate level 0K. Besides encryption keys, the writable memory array 13 may also store user ID or the information related to the printed data-array sequence.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A method of making a three-dimensional writable printed memory (3D-wP), comprising the steps of:
   1) forming a substrate circuit on a semiconductor substrate;
   2) recording custom data using a direct-write lithography;
   3) recording content data into a plurality of vertically stacked memory levels above said substrate using a printing means, wherein said memory levels are stacked above and coupled to said substrate;
   wherein the total amount of said custom data is less than 1% of the total amount of said content data.

2. The method according to claim 1, wherein said direct-write lithography is e-beam lithography.

3. The method according to claim 1, wherein said direct-write lithography is laser-beam lithography.

4. The method according to claim 1, wherein said direct-write lithography is focused ion-beam lithography.

5. The method according to claim 1, wherein said printing means is photo-lithography.

6. The method according to claim 1, wherein said printing means is imprint-lithography.

7. The method according to claim 1, wherein step 3) is performed during step 2).

8. The method according to claim 1, wherein step 3) is performed before step 2).

9. The method according to claim 1, wherein the minimum feature size of the data-coding layer of said writable memory array is larger than the minimum feature size of the data-coding layer of said memory levels.

* * * * *